United States Patent [19]
Takahashi

[11] Patent Number: 5,929,485
[45] Date of Patent: Jul. 27, 1999

[54] HIGH VOLTAGE INSULATED GATE TYPE BIPOLAR TRANSISTOR FOR SELF-ISOLATED SMART POWER IC

[75] Inventor: Kenichiro Takahashi, Tokyo, Japan

[73] Assignee: NEC Corporation, Tokyo, Japan

[21] Appl. No.: 08/824,318

[22] Filed: Mar. 26, 1997

[30] Foreign Application Priority Data

Mar. 28, 1996 [JP] Japan ................................. 8-073692

[51] Int. Cl.$^6$ ........................... H01L 29/76; H01L 29/94; H01L 31/062
[52] U.S. Cl. ........................... 257/343; 257/378; 257/409
[58] Field of Search ................... 257/328, 343, 257/378, 409

[56] References Cited

FOREIGN PATENT DOCUMENTS 61-276250  12/1986  Japan ..................................... 257/343
5-283622   10/1993  Japan ..................................... 257/343

*Primary Examiner*—Steven H. Loke

[57] ABSTRACT

On a surface of one device region defined at a surface of a P-type silicon substrate, a gate electrode is formed on a thermal oxidation layer. An N-type source diffusion layer is formed at the surface of the device region, and a P-type substrate contact layer is formed adjacent the source diffusion layer. On the other hand, an N-type drain diffusion layer is formed at the surface of the other device region defined at the surface of the silicon substrate. A P-type emitter diffusion layer is formed at the surface of the center portion of the drain diffusion layer. The P-type emitter diffusion layer is confined in the drain diffusion layer. Also, an emitter terminal is connected to the emitter diffusion layer. A collector-source terminal is connected to source diffusion layer and a substrate contact layer. Also, a gate terminal is connected to the gate electrode.

2 Claims, 3 Drawing Sheets

HIGH VOLTAGE INSULATED GATE TYPE BIPOLAR TRANSISTOR FOR SELF-ISOLATED SMART POWER IC

BACKGROUND OF THE INVENTION

1. Field of the Invention

The present invention relates generally to a bipolar transistor to be employed in an integrated circuit for driving an EL display, a plasma display and the like. More specifically, the invention relates to a insulated gate type bipolar transistor having high tolerance voltage which can be formed together with a low voltage control circuit on a single semiconductor substrate.

2. Description of the Prior Art

In the conventional integrated circuit for driving an EL display and a plasma display, a low voltage type CMOS logic circuit which has operation voltage about 5V, is employed at an input side, and N-channel type insulated gate type field effect transistor, for example is employed at an output side.

FIG. 1 is a section showing a structure of an output transistor in the conventional integrated circuit for driving the EL display. This will be referred to as hereinafter as "first prior art". Field insulation layers 21 are selectively formed at a surface of a P-type semiconductor substrate 1. By this, device regions are defined in the semiconductor substrate. Thermal oxidation layers 2 serving as a gate oxide layer are selectively formed on the surface of the device region in a thickness thinner than that of the field insulation layers 21. Stripe form gate electrodes 3 are formed in a region extending over the thermal oxidation layers 2 and the field insulation layers 21.

Also, at the surface of the P-type semiconductor substrate 1 at the device region side where the thermal oxidation layer 2 is not formed, in a region extending over the adjacent field insulation layer 21, an N-type drain well diffusion layer 4 and an N-type extended drain diffusion layer 5, which has a depth shallower than and an area wider than the N-type drain well diffusion layer 4, are formed. An extended drain type drain diffusion layer having high tolerance voltage is formed by the drain well diffusion layer 4 and the extended drain diffusion layer 5. An N-type high concentration drain layer 13 with a depth shallower than that of the N-type extended drain diffusion layer 5 and having higher concentration than the latter is formed at the surface of the center portion of the drain diffusion layer.

An N-type source diffusion layer 7 is formed at the surface of the P-type semiconductor substrate 1 in the device region side where the thermal oxidation layer 2 is formed, and a P-type substrate contact layer 8 is formed adjacent the source diffusion layer 7. The P-type substrate contact layer 8 is contacted with the N-type source diffusion layer 7 and is distanced from a gate electrode 3 in greater distance than that of the N-type source diffusion layer 7.

A surface insulation layer 11 is formed over the entire surface. The surface insulation layer 11 provided with contact holes in regions aligning with the center portions of respective device regions. A drain terminal 15 is formed on the surface of the N-type high concentration drain layer 13 exposed by formation of the contact hole. Also, source terminals 14 are formed on the surfaces of the N-type source diffusion layer 7 and the P-type substrate contact layer 8 exposed by formation of the contact holes.

An insulated gate field effect transistor of normally horizontal structure is employed at the output side in the conventional integrated circuit for driving the EL display. This is because that the field effect transistor shown in FIG. 1 is easy to fabricate and is suitable for circuit construction with the low-voltage type control circuit formed at the input side.

As a transistor which can be formed together with the low-voltage type control circuit on a common semiconductor substrate, there is an insulated gate type bipolar transistor having a structure different from that of the first prior art. This will be referred to as "second prior art". FIG. 2 is a section showing a structure of the insulation gate type bipolar transistor of the second prior art. In the second prior art, like elements to those in the first prior art shown in FIG. 1 will be identified by like reference numerals and detailed description therefor will be neglected for simplification of disclosure.

In the second prior art, an N-type epitaxial layer 16 is grown on the surface of the P-type semiconductor substrate 1. At the surface of the N-type epitaxial layer 16 at the device region side not formed the thermal oxidation layer 2, a P-type emitter diffusion layer 17 is formed on the region extending over the adjacent field insulation layer 21. The P-type emitter diffusion layer 17 is formed at a position distanced from the gate electrode in a distance range of 10 to several ten μm.

On the other hand, a P-type base diffusion layer 19 is formed at the surface of the N-type epitaxial layer 16 at the device region side where the thermal oxidation layer 2 is formed. An N-type source diffusion layer 20 is formed at the surface of the center portion of the P-type base diffusion layer 19. A P-type insulation diffusion layer 18 contacting with the P-type base diffusion layer 19 at a position away from the gate electrode 3 is formed in a region extending from the surface of the N-type epitaxial layer 16 to the surface of the P-type semiconductor substrate 1.

Also, via the contact hole provided in the surface insulation layer 11, the P-type base diffusion layer 19 and the N-type source diffusion layer 20 are connected to have the same potential to lead out from the device as a collector terminal 10. Similarly, via the contact hole provided in the surface insulation layer 11, the emitter terminal 9 is lead out from the P-type emitter diffusion layer 17, and the gate terminal (not shown) is lead out from the gate electrode 3.

In the first prior art, there is no process step for significantly increasing fabrication cost, such as growth process of an epitaxial layer, forming process of insulation diffusion layer and so forth. Each diffusion layer is formed by only process of introducing impurity from the surface of the semiconductor substrate. Accordingly, in fabrication of the driving integrated circuit having a self-separation structure which is low in fabrication cost, a horizontal type insulation gate field effect transistor is typically selected as high rating voltage output transistor.

However, when the driving integrated circuit is fabricated with employing the insulation gate type field effect transistor of the first prior art, the following problem will be encountered. Namely, the driving integrated circuit typically has several tens or more in number of high rating voltage output transistors and corresponding output terminals in one circuit. Each output terminal is directly connected to corresponding scanning line electrode. The scanning line electrodes of the EL display and plasma display become loads of the driving integrated circuit. This load is capacity type having large charge amount and discharge amount, and the capacitance of each scanning line becomes several nF. As set forth, since the capacitance of the scanning line electrode is large, the rated value of the output current of the driving integrated circuit becomes several hundreds mA per one output which should be large current for the integrated circuit. In order to realize large rated current, since the gate width of the output transistor is formed to have large width, sixty to seventy percent of chip area is occupied by the output transistor.

On the other hand, when the output transistor is turned on, namely in transition from steady state at off state to steady state at on state, since the scanning line electrode to be the load is capacitance type, a variation trace (load line) between a drain voltage and a drain current of the output transistor becomes a trace close to a thermal breakdown point. Accordingly, it becomes necessary to certainly provide sufficient distance between the thermal breakdown point and the load line.

As a method to certainly provide sufficient distance between the thermal breakdown line and the load line, there is a method to restrict heat generation amount per unit area, in addition to the method for improving radiation efficiency. When heat generation amount per unit area is restricted, a problem to further increase the chip area is encountered.

In the recent years, increasing of screen size and increasing of display colors of the EL display and plasma display, the output rated current of the driving integrated circuit is increased. This should significantly increase the chip area.

On the other hand, the operation characteristics of the insulated gate type bipolar transistor of the second prior art, a current value may not be saturated even when the voltage is increased in the on state. Namely, the operation resistance is maintained low up to large current region, heat radiation within the transistor is small even in large current state. Also, a sufficient distance between the thermal breakdown point and the drain voltage - drain current trace (load line) upon transition from the steady state at off state to the steady state at on state, can be present. Accordingly, when the insulated gate type bipolar transistor is employed as the output transistor of the driving integrated circuit, the problem in the case where the first prior art has been generated is not encountered.

However, as set forth above, in order to form the insulated gate type bipolar transistor shown in FIG. 2, the fabrication process, such as growth of epitaxial layer and formation of the insulation diffusion layer and so forth, becomes necessary to cause significant increase of the fabrication cost.

SUMMARY OF THE INVENTION

It is an object of the present invention to provide an insulated gate type bipolar transistor which does not require growth process of epitaxial layer and formation process of insulation diffusion layer, prevents increasing of fabrication cost, and can restrict increasing of a chip area.

An insulated gate type bipolar transistor, according to the present invention has a first conductivity type semiconductor layer. A second conductivity type source diffusion layer is selectively formed at the surface of the semiconductor layer. A second conductivity type drain diffusion layer is selectively formed at the surface of the semiconductor layer at a position distanced from the source diffusion layer. A first conductivity type emitter diffusion layer is formed at the surface of the drain diffusion layer. This emitter diffusion layer is completely confined in the drain diffusion layer. An insulation layer is formed on a region between the source diffusion layer and the drain diffusion layer at the surface of the semiconductor layer. A gate electrode is formed on the surface of the insulation layer. A collector terminal is formed on a region of the semiconductor layer where the source diffusion layer and the drain diffusion layer are not formed and electrically connected to the semiconductor layer. An emitter terminal electrically connected to the emitter diffusion layer and a source terminal electrically connected to the source diffusion layer are formed.

The first conductivity type semiconductor layer may be formed on the surface of a semiconductor substrate. The source terminal and the collector terminal may be formed integrally and thus the source diffusion layer and the semiconductor layer may be in the same potential.

The bipolar transistor may preferably comprise an insulation region formed at the surface of the drain diffusion layer in the outer peripheral portion of the emitter diffusion layer. It should be appreciated that forming the insulation region is optional and not essential. The insulation region may be formed by forming a groove and subsequently filling an insulative material within the groove. The insulation region may be formed with completely surrounding the circumference of the emitter diffusion layer, or, in the alternative with partly surrounding the circumference of the emitter diffusion layer. The insulation region may be formed in a depth greater than or equal to the half of depth of the emitter diffusion layer, or in the alternative, in a depth greater than the depth of the emitter diffusion layer.

The gate electrode may be made of polycrystalline silicon. The collector terminal, the emitter terminal and the source terminal may be made of aluminum.

In the present invention, within the first conductivity type semiconductor layer, the bipolar transistor taking the emitter diffusion layer as the emitter, the drain diffusion layer as the base and the semiconductor layer as the collector is formed. Since the bipolar transistor is vertical type, the collector current flows in the vertical direction and thus not concentrate on the surface. Accordingly, the maximum current which can be flown in the substrate can flow.

Also, the collector current of the bipolar transistor is controlled by the base current. The base current is controlled by the insulated gate type field effect transistor taking the gate electrode as the gate. Namely, the insulation gate has quite high input resistance. Therefore, little power is required for control. Therefore, by applying the control signal voltage to the insulation gate, the maximum current to be flown in the semiconductor layer can be controlled. Accordingly, the insulated gate type bipolar transistor can have self-separated structure which can be formed together with other circuit, such as low-voltage type control circuit, e.g. low-voltage type CMOS logic circuit, on a common semiconductor substrate.

Also, in the present invention, since the growth of the epitaxial layer and formation of the insulation diffusion layer become unnecessary, fabrication process can be simplified to significantly lower fabrication process.

Furthermore, in the present invention, when the emitter diffusion layer is surrounded by the insulation region, the drain current controlled by the gate voltage may significantly act as the base current of the bipolar transistor, the output current per unit area can be improved.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

Figure 1:
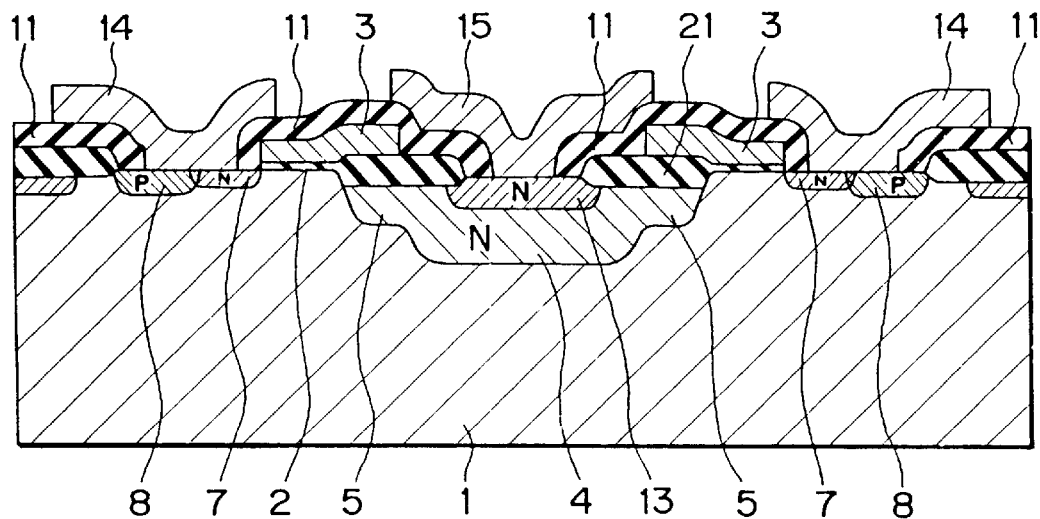
FIG. 1 is a section showing an output transistor structure in the conventional integrated circuit for driving an EL display.
Figure 2:
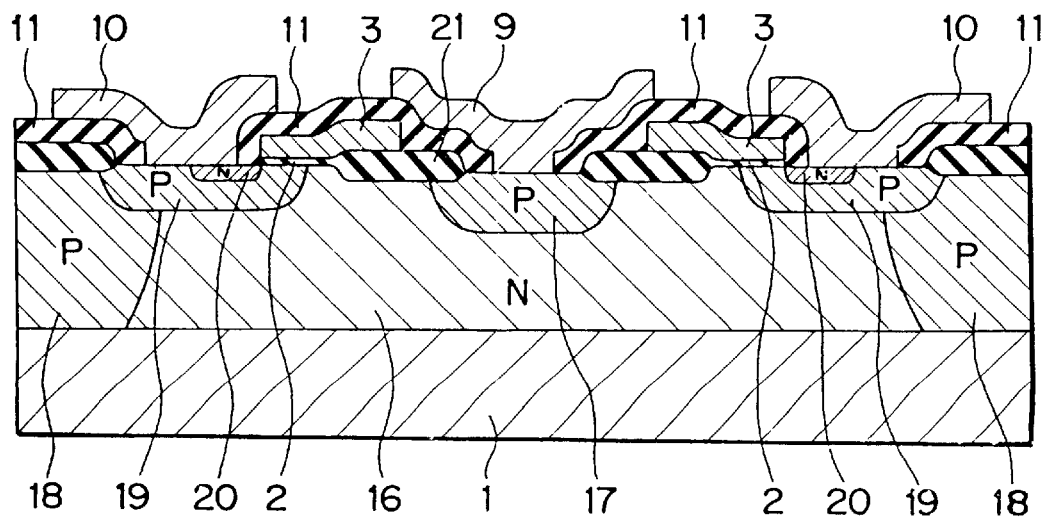
FIG. 2 is a section showing a structure of an insulated gate type bipolar transistor of the second prior art.
Figure 3:
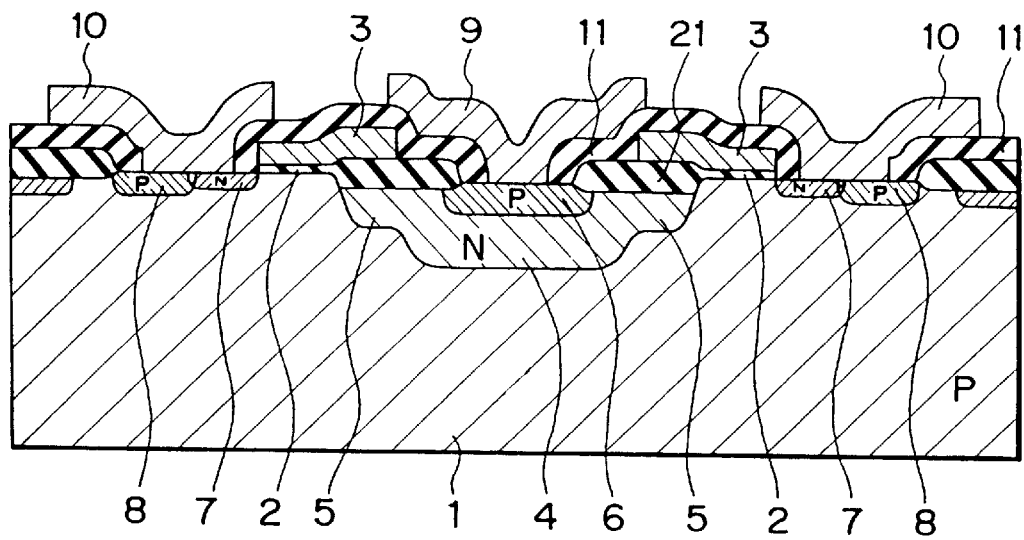
FIG. 3 is a section showing a structure of the first embodiment of an insulated gate type bipolar transistor according to the present invention.

FIG. 3 is a section showing a structure of the first embodiment of an insulated gate type bipolar transistor according to the present invention. As shown in FIG. 3, field insulation layers 21 are selectively formed at the surface of a P-type silicon substrate (first conductivity type semiconductor layer) 1 having a resistively of 20 Ωcm. By this, device regions are defined on the surface of the substrate 1. On the other hand, a thermal oxidation layers (insulation layer) 2 to be the gate insulation layer are selectively formed on the surface of the device region in a thickness thinner than the field insulation layers 21. Then, gate electrodes 3 made of phosphorous doped polycrystalline silicon are formed in the region extending over the field insulation layer 21 and the thermal oxidation layer 2 in a thickness of appropriately 600 nm.

An N- type drain well diffusion layer 4 is provided at the surface of the P-type silicon substrate 1 at the device region side where the thermal oxidation layer 2 is not formed. The diffusion layer 4 is formed in a depth of 5 μm in a region extending over adjacent field insulation layer 21. Also, an N-type extended drain diffusion layer (second conductivity type drain diffusion layer) 5 is formed in a depth of 3 μm in the region wider than the N-type drain well diffusion layer 4. A P-type emitter diffusion layer (first conductivity type emitter diffusion layer) 6 is formed at the surface of the center portion of the drain diffusion layer 5 in the depth of 2 μm as enclosed by the drain diffusion layer 5.

N-type source diffusion layers (second conductivity type source diffusion layer) 7 are formed at the surface of the P-type silicon substrate 1 in the device region side where the thermal oxide layer 2 are formed. P-type substrate contact layers 8 are formed adjacent the source diffusion layer 7. The P-type substrate contact layer 8 is in contact with the N-type source diffusion layer 7 and is formed at a position away from the gate electrode 3 in greater distance than the N-type source diffusion layer 7.

Over the entire surface, a surface insulation layer 11 is formed. The surface insulation layer 11 is provided with contact holes in the regions aligning with center portions of respective device regions. An emitter terminal 9 made of aluminum is formed on the surface of the P-type emitter diffusion layer 6 exposed by formation of the contact hole. Also, collector-source terminals 10 made of aluminum are formed on the surface of the N-type source diffusion layer 7 and the P-type substrate contact layer 8 exposed by formation of the contact hole. Also, a gate terminal (not shown) made of aluminum is connected to the gate electrode 3.

In the shown embodiment constructed as set forth above, within the P-type silicon substrate 1, a pnp bipolar transistor is formed with taking the emitter diffusion layer 6 as an emitter, the N-type drain well diffusion layer 4 as base and the P-type silicon substrate 1 as collector. The pnp bipolar transistor is a vertical type, in which the collector current flows in vertical direction and will not concentrate on the surface. Accordingly, the possible maximum current of the silicon substrate 1 can flow.

Also, the collector current of the pnp bipolar transistor is controlled by the base current. The base current is controlled by the insulated gate-type field effect transistor taking the gate electrode 3 as a gate. The insulation gate has quite high input resistance and thus little power is required for control therefor. Thus, by applying a control signal voltage for the insulation gate, the maximum current to flow in the silicon substrate can be controlled.

In the shown embodiment, since the epitaxial layer and buried diffusion layer are not formed, all diffusion layers can be formed by diffusing impurity from the surface of the semiconductor substrate. Thus, fabrication process can be simplified.

It should be noted that while the P-type silicon substrate is employed in the shown embodiment, the P-type well diffusion layer formed on the silicon substrate may be used in place of the P-type silicon substrate 1.

Figure 4:
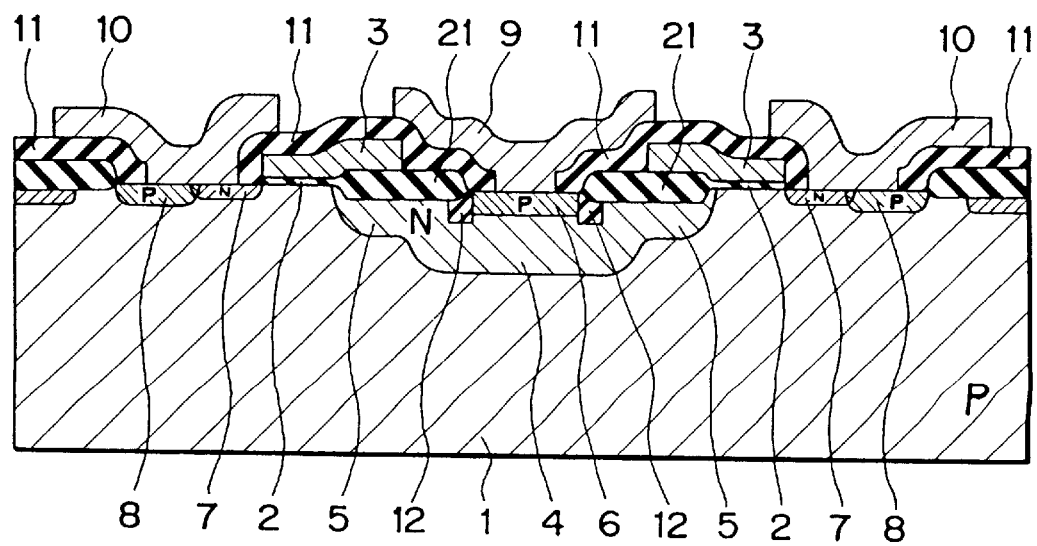
FIG. 4 is a section showing a structure of the second embodiment of an insulated gate type bipolar transistor according to the present invention.

FIG. 4 is a section showing the second embodiment of the insulated gate type bipolar transistor according to the present invention. In the second embodiment shown in FIG. 4, like elements to those of the first embodiment in FIG. 3 may be identified by like reference numerals, and detailed description will be neglected for simplification of the disclosure. Even in the second embodiment, similarly to the first embodiment, the epitaxial layer and the buried diffusion layer are not formed. Thus, all of the diffusion layers can be formed by diffusing impurity from the surface of the semiconductor substrate. Furthermore, similar advantages to the first embodiment can be achieved in the structure of the diffusion layer of the semiconductor substrate and structures of the insulation layer and electrode wiring on the surface of the semiconductor substrate.

In the second embodiment, a groove (insulation region) 12 filled with insulative material is formed on the outer peripheral portion of the P-type emitter diffusion layer 6 in the depth about 1.5 μm. It should be noted that the P-type emitter diffusion layer 6 and the groove 12 are confined in the N-type drain well diffusion layer 4.

In the insulated gate type bipolar transistor constructed as set forth above, when a positive voltage of 200V, for example is applied to the emitter terminal 9 via the load and when a bias of ground potential is applied to the collector-source terminal 10, the current will flow from the emitter diffusion layer 6 to the N-type source diffusion layer 7 through the N-type drain well diffusion layer 4 and the surface of the semiconductor substrate right below the gate electrode 3 depending upon the voltage applied to the gate electrode 3. At this time, the current flows below the groove 12 filled with the insulative material.

In the shown embodiment, since the groove 12 filled with the insulative material is formed, the drain current controlled by the gate voltage significantly act on the pnp bipolar transistor as the base current to improve the output current per unit area.

Figure 5A:
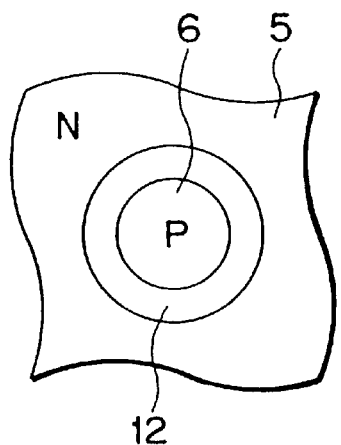
FIG. 5A is a plan view showing a configuration of a groove 12 of FIG. 4.
Figure 5B:
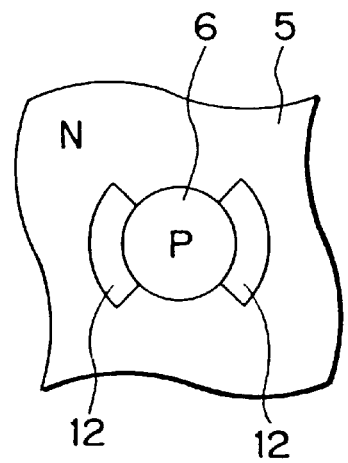
FIG. 5B is a plan view showing another configuration of the groove 12.
Figure 5C:
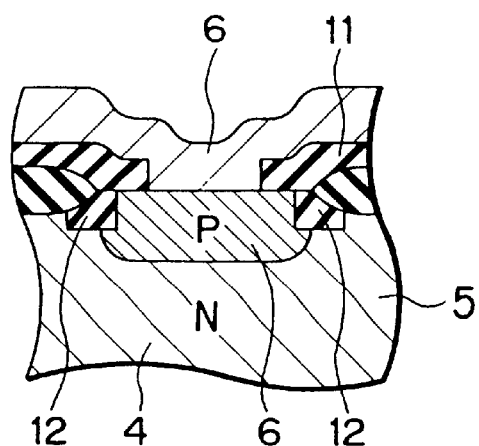
FIG. 5C is a section showing a further configuration of the groove 12.

FIG. 5A is a plan view showing a configuration of a groove 12 of FIG. 4, FIG. 5B is a plan view showing another configuration of the groove 12, and FIG. 5C is a section showing a further configuration of the groove 12. It should be noted that, in FIGS. 5A and 5B, the emitter terminal 9, the surface insulation layer 11 and the field insulation layer 21 are not illustrated. As shown in FIG. 5A, in the second embodiment, the groove 12 is formed to be deeper that the depth of the emitter diffusion layer 6, and the groove 12 is formed surrounding the outer peripheral portion of the emitter diffusion layer 6, thus, the output current per unit area can be improved.

Also, as shown on FIG. 5B, when there is any restriction to lay out, the groove 12 may be formed with partly surrounding the circumference of the emitter diffusion layer 6. Furthermore, as shown on FIG. 5C, when there is any restriction in fabrication condition, it is not essential to form the groove 12 in greater depth than the depth of the emitter diffusion layer 6. By forming the groove in the depth greater than or equal to the half of the depth of the emitter diffusion layer, the output current can be improved.

In the shown embodiment, since it becomes unnecessary to grow the epitaxial layer and formation of the insulation diffusion layer, the fabrication process can be simplified. In conjunction therewith, the fabrication cost can be significantly reduced to make it possible to obtain insulated gate type bipolar transistor suitable for large current operation. Also, the bipolar transistor of the shown embodiment can be formed on the semiconductor substrate formed with the low-voltage type control circuit. Furthermore, the bipolar transistor can have self separated structure which can be formed together with other circuit, such as low-voltage type control circuit, e.g. low voltage type CMOS logic circuit.

Also, when the emitter diffusion layer 6 can be surrounded by the groove 12 filled with the insulative material, the drain current controlled by the gate voltage can significantly act as the base current of the bipolar transistor. Thus, the output current per unit area can be improved.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. An insulated gate type bipolar transistor comprising:
a first conductivity type semiconductor layer;
a second conductivity type source diffusion layer selectively formed at the surface of said semiconductor layer;
a second conductivity type drain diffusion layer selectively formed at the surface of said semiconductor layer at a position distanced from said source diffusion layer;
a first conductivity type emitter diffusion layer formed at the surface of said drain diffusion layer, said emitter diffusion layer being completely confined in said drain diffusion layer;
an insulation layer formed on a region between said source diffusion layer and said drain diffusion layer at the surface of said semiconductor layer;
a gate electrode formed on the surface of said insulation layer;
a collector terminal formed on a region of said semiconductor layer where said source diffusion layer and said drain diffusion layer are not formed, which collector terminal being electrically connected to said semiconductor layer;
an emitter terminal electrically connected to said emitter diffusion layer;
a source terminal electrically connected to said source diffusion layer; and
an insulation region formed at the surface of said drain diffusion layer in the outer peripheral portion of said emitter diffusion layer,
wherein said insulation region is formed in a depth greater than or equal to the half of depth of said emitter diffusion layer.

2. An insulated gate type bipolar transistor comprising:
a first conductivity type semiconductor layer;
a second conductivity type source diffusion layer selectively formed at the surface of said semiconductor layer;
a second conductivity type drain diffusion layer selectively formed at the surface of said semiconductor layer at a position distanced from said source diffusion layer;
a first conductivity type emitter diffusion layer formed at the surface of said drain diffusion layer, said emitter diffusion layer being completely confined in said drain diffusion layer;
an insulation layer formed on a region between said source diffusion layer and said drain diffusion layer at the surface of said semiconductor layer;
a gate electrode formed on the surface of said insulation layer;
a collector terminal formed on a region of said semiconductor layer where said source diffusion layer and said drain diffusion layer are not formed, which collector terminal being electrically connected to said semiconductor layer;
an emitter terminal electrically connected to said emitter diffusion layer;
a source terminal electrically connected to said source diffusion layer; and
an insulation region formed at the surface of said drain diffusion layer in the outer peripheral portion of said emitter diffusion layer,
wherein said insulation region is formed in a depth greater than the depth of said emitter diffusion layer.

* * * * *